(12) United States Patent
Chen et al.

(10) Patent No.: US 10,985,334 B2
(45) Date of Patent: Apr. 20, 2021

(54) MODULE STRUCTURES AND FLEXIBLE DISPLAY DEVICES

(71) Applicant: KunShan Go-Visionox Opto-Electronics Co., Ltd., Kunshan (CN)

(72) Inventors: Lingyan Chen, Kunshan (CN); Renjie Liu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/456,660

(22) Filed: Jun. 28, 2019

(65) Prior Publication Data

US 2019/0326530 A1    Oct. 24, 2019

Related U.S. Application Data

(63) Continuation of application No. PCT/CN2018/092170, filed on Jun. 21, 2018.

(30) Foreign Application Priority Data

Dec. 29, 2017   (CN) .......................... 201721923369.5

(51) Int. Cl.
*G06F 3/041* (2006.01)
*H01L 51/00* (2006.01)
*H01L 27/32* (2006.01)
*H01L 51/52* (2006.01)

(52) U.S. Cl.
CPC ........ *H01L 51/0097* (2013.01); *G06F 3/0412* (2013.01); *H01L 27/32* (2013.01); *H01L 51/5293* (2013.01); *G06F 2203/04102* (2013.01)

(58) Field of Classification Search
CPC .... H01L 51/0097; H01L 27/32; G06F 3/0412
USPC .................................................. 345/174, 204
See application file for complete search history.

(56) References Cited

U.S. PATENT DOCUMENTS

| | | | |
|---|---|---|---|
| 2015/0277099 A1* | 10/2015 | Hong | G06T 1/20 345/520 |
| 2015/0378391 A1* | 12/2015 | Huitema | G09F 9/301 361/679.03 |
| 2016/0066411 A1* | 3/2016 | Hong | G06F 3/044 174/254 |
| 2018/0204884 A1* | 7/2018 | Isa | H01L 51/0097 |
| 2018/0350995 A1* | 12/2018 | Kim | H01L 29/41733 |
| 2019/0075688 A1* | 3/2019 | Chen | H01L 51/0097 |

FOREIGN PATENT DOCUMENTS

| | | |
|---|---|---|
| CN | 105975135 A | 9/2016 |
| CN | 106847870 A | 6/2017 |
| CN | 107221256 A | 9/2017 |
| CN | 107516472 A | 12/2017 |

* cited by examiner

*Primary Examiner* — Calvin C Ma
(74) *Attorney, Agent, or Firm* — Rimon PC

(57) ABSTRACT

A module structure includes a support film layer. The support film layer includes a film layer body and a stress relief gap disposed in the film layer body. The stress relief gap includes a layer gap, and the film layer body is divided into stacked sub-layers by the layer gap. In the module structure according to the embodiments of the present application, the stress relief gap is disposed in the film layer body of the support film layer.

18 Claims, 7 Drawing Sheets

MODULE STRUCTURES AND FLEXIBLE DISPLAY DEVICES

CROSS-REFERENCE TO RELATED APPLICATIONS

The present application is a continuation of International Application No. PCT/CN2018/092170 filed on Jun. 21, 2018, which claims priority to Chinese patent application No. 201721923369.5, filed on Dec. 29, 2017. Both applications are incorporated herein by reference in their entireties.

TECHNICAL FIELD

The present application relates to display technologies, and in particular to module structures and flexible display devices including the module structures.

BACKGROUND

With the continuous development of electronic display technology, requirements for display screens of electronic devices are getting higher and higher. As one of important development directions of the display screens of electronic devices, flexible screens (i.e., flexible display devices) have characteristics such as bendability and strong flexibility, and have multiple advantages such as being light and thin, low power consumption, convenient carrying, strong plasticity and beautiful colors. Therefore, the flexible screens have gradually received more and more attention.

SUMMARY

In view of this, embodiments of the present application provide module structures and flexible display devices including the module structures.

In a first aspect, an embodiment of the present application provides a module structure including a support film layer. The support film layer includes a film layer body and a stress relief gap disposed in the film layer body, and the stress relief gap includes a layer gap. The film layer body is divided into stacked sub-layers by the layer gap.

In an embodiment of the present application, the stress relief gap further includes at least one linear gap disposed in at least one of the sub-layers of the film layer body.

In an embodiment of the present application, the linear gap includes one or a combination of a strip gap, a curved gap and a fold linear gap.

In an embodiment of the present application, the linear gap includes a strip gap disposed along a direction parallel to an extension direction of the sub-layers and extends through both ends of at least one of the sub-layers in the extension direction of the sub-layers.

In an embodiment of the present application, at least one of the sub-layers includes a plurality of strip gaps arranged at intervals, and the plurality of strip gaps are located in a same straight line.

In an embodiment of the present application, at least one of the sub-layers includes a plurality of strip gaps arranged at intervals, and in a same sub-layer, spacing between adjacent strip gaps in a longitudinal direction is from 1 mm to 40 mm.

In an embodiment of the present application, each sub-layer includes a bending area and a non-bending area, and the stress relief gap further includes a hole-shaped gap disposed in the bending area of at least one of the sub-layers.

In an embodiment of the present application, the stress relief gap further includes a hole-shaped gap disposed in the non-bending area of at least one of the sub-layers, an aperture of the hole-shaped gap in the bending area is consistent with an aperture of the hole-shaped gap in the non-bending area, and a density of the hole-shaped gap in the bending area is greater than a density of the hole-shaped gap in the non-bending area.

In an embodiment of the present application, the stress relief gap further includes a hole-shaped gap disposed in the non-bending area of at least one of the sub-layers, a density of the hole-shaped gap in the bending area is consistent with a density of the hole-shaped gap in the non-bending area, and an aperture of the hole-shaped gap in the bending area is larger than an aperture of the hole-shaped gap in the non-bending area.

In an embodiment of the present application, the hole-shaped gap is a blind hole.

In an embodiment of the present application, the hole-shaped gap is a circular hole.

In an embodiment of the present application, the hole-shaped gap includes a circular hole having a diameter of 30 nm to 300 μm.

In a second aspect, another embodiment of the present application provides a flexible display device including the module structure described in any of the above embodiments.

In the module structure according to the embodiments of the present application, the stress relief gap is disposed in the film layer body of the support film layer. Therefore, a stress generated by the module structure during bending is well released, and shedding of any film layer occurred in the module structure is effectively prevented.

DETAILED DESCRIPTION

In order to make objects, technical means and advantages of the present application clearer, the present application will be further described in detail below with reference to the accompanying drawings.

Figure 1:
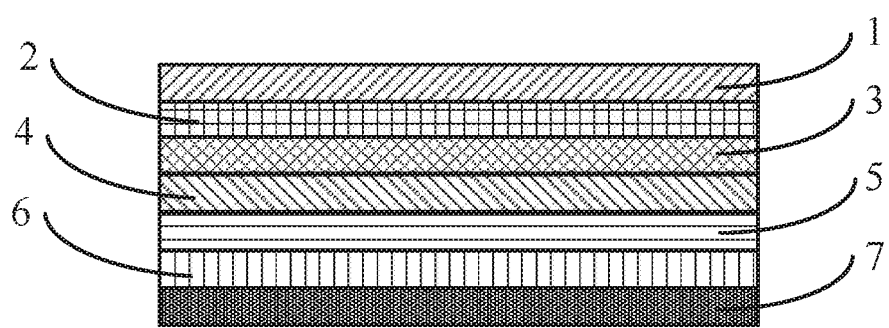
FIG. 1 is a schematic cross-sectional structural diagram of a flexible display device according to an embodiment of the present application.

FIG. 1 is a schematic cross-sectional structural diagram of a flexible display device according to an embodiment of the present application. As shown in FIG. 1, in one exemplary embodiment, the flexible display device includes a cover layer 1, an Optically Clear Adhesive (OCA) layer 2, a polarizer layer 3, a Touch Panel (TP) layer 4, an Optically Clear Adhesive (OCA) layer 5, an Organic Light-Emitting Diode (OLED) layer 6 and a support film layer 7 which are sequentially stacked. And other film layers except the OLED layer 6 belong to a module structure of the flexible display device. The flexible display device is subjected to a large stress during bending. The film layers may be shed from the flexible display device by the large stress, and then the display effect of the flexible display device is affected.

Figure 2:
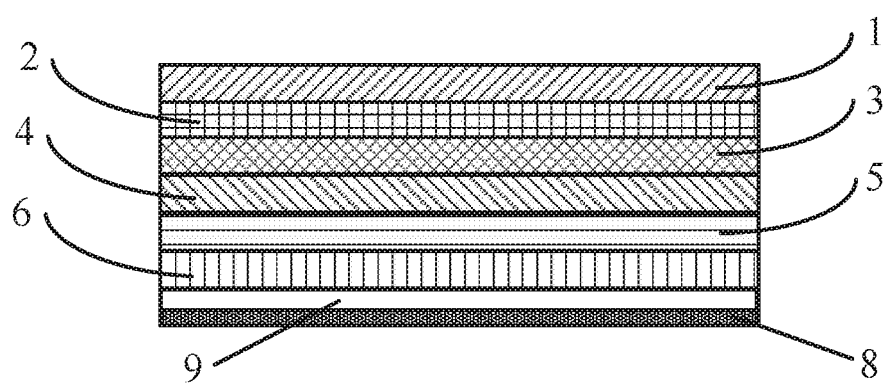
FIG. 2 is a schematic cross-sectional structural diagram of a module structure according to an embodiment of the present application.
Figure 3:
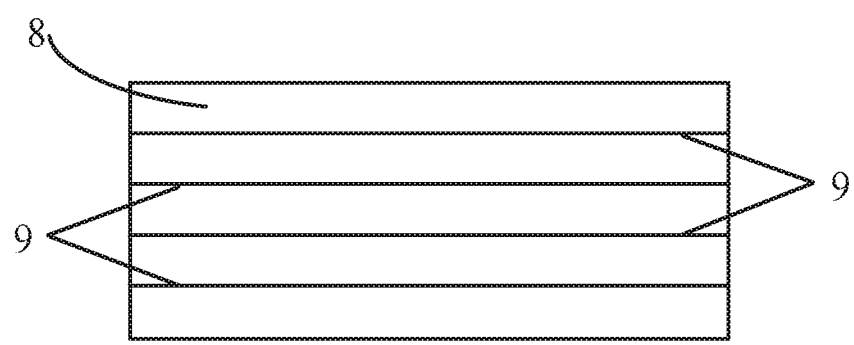
FIG. 3 is a schematic top plan structural diagram of a support film layer of a module structure according to an embodiment of the present application.

FIG. 2 is a schematic cross-sectional structural diagram of a module structure according to an embodiment of the present application. FIG. 3 is a schematic top plan structural diagram of a support film layer of a module structure according to an embodiment of the present application. As shown in FIG. 2 and FIG. 3, the module structure according to the embodiment of the present application includes multiple layers stacked from top to bottom (i.e., a top-bottom direction of the module structure along an orientation shown in FIG. 2). The multiple layers include a cover layer 1, an OCA layer 2, a polarizer layer 3, a TP layer 4, an OCA layer 5 and a support film layer disposed on a side (i.e., the lower side in FIG. 2) of an OLED layer 6 away from the OCA layer 5 (it may be understood that the other film layers except the OLED layer 6 belong to the module structure). The support film layer includes a film layer body 8 and linear gaps disposed in an upper surface (i.e., the upper surface along the orientation shown in FIG. 2) of the film layer body 8. A bending direction of the support film layer refers to a direction when the left and right ends of the film layer body 8 of the support film layer shown in FIG. 3 are upward or downward.

Specifically, the film layer body 8 is made of a rectangular film. The linear gaps include a number of strip gaps 9. The strip gaps 9 are disposed perpendicular to a non-extension direction of the film layer body 8 (i.e., a top-bottom direction of the film layer body 8 along an orientation shown in FIG. 3), and extend through both ends of the film layer body 8 in an extension direction of the film layer body 8 (i.e., a left-right direction of the film layer body 8 along the orientation shown in FIG. 3). That is, the strip gaps 9 continuously extend from one end of the film layer body 8 to the other end of the film layer body 8 in the extension direction of the film layer body 8. Further, the film layer body 8 is not vertically penetrated (i.e., a front-rear direction of the film layer body 8 along the orientation shown in FIG. 3) by the strip gaps 9.

In the module structure according to the embodiments of the present application, the strip gaps are disposed in the upper surface of the film layer body of the support film layer, and the strip gaps are disposed perpendicular to the non-extension direction of the film layer body and extend through the both ends of the film layer body in the extension direction of the film layer body. Therefore, a stress generated by the module structure during bending is well released, and shedding of each film layer occurred in the module structure is effectively prevented.

It may be understood that the support film layer of the module structure mentioned in the embodiments of the present application refers to a lower protective film layer of the module structure.

Figure 4:
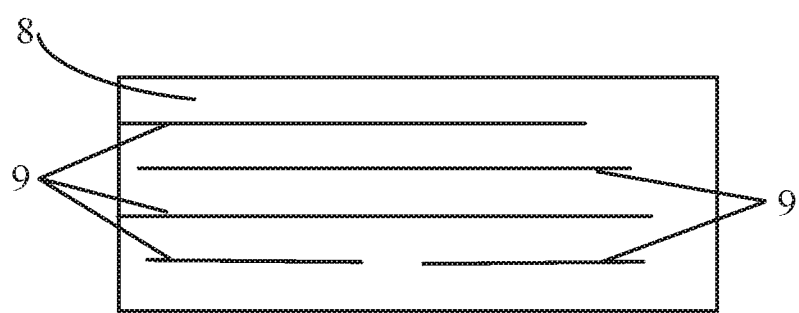
FIG. 4 is a schematic top plan structural diagram of a support film layer of a module structure according to another embodiment of the present application.

FIG. 4 is a schematic top plan structural diagram of a support film layer of a module structure according to another embodiment of the present application. The embodiment of the present application extends on the basis of the embodiment shown in FIG. 2 and FIG. 3 of the present application. Differences are described below, and similarities are not described again.

As shown in FIG. 4, in the support film layer of the module structure according to the embodiment of the present application, the strip gaps 9 do not extend through both ends of the extension direction of the film layer body 8 (i.e., a left-right direction of the film layer body 8 along the orientation shown in FIG. 4). But according to an actual situation, the strip gaps 9 extend through either end of the extension direction of the film layer body 8 (i.e., the left-right direction of the film layer body 8 along the orientation shown in FIG. 4) or terminated between the both ends of the extension direction of the film layer body 8 (i.e., the left-right direction of the film layer body 8 along the orientation shown in FIG. 4).

Preferably, a plurality of strip gaps 9 are arranged in a same straight line. That is, the plurality of strip gaps 9 are arranged intermittently and collinearly. Therefore, the bending stress generated by the module structure may be effectively dispersed, and the support effect made by the support film layer may be sufficient.

In the module structure according to the embodiments of the present application, the strip gaps of the support film layer extend through either end of the extension direction of the film layer body or terminated between the both ends of the extension direction of the film layer body, and a plurality of strip gaps are arranged in the same straight line. Therefore, the shedding of the film layers occurred in the module structure is prevented effectively, and meanwhile the adaptability of the module structure according to embodiments of the present application is further improved.

It may be understood that, in the module structure according to the above embodiments of the present application, the strip gaps 9 of the support film layer may not be perpendicular to the non-extension direction of the film layer body 8 (but the strip gaps 9 and straight lines which the strip gaps 9 are located do not penetrate either end of the film layer body 8 in the non-extension direction of the film layer body 8). Meanwhile, any two strip gaps 9 are not intersect or not parallel. Therefore, an incision may not be generated in the support film layer during the bending process, and the adaptability of the support film layer is improved.

In addition, it may be understood that, in the module structure according to the above embodiments of the present application, whether the strip gaps 9 of the support film layer penetrate the film layer body 8 in a vertical direction (i.e., a front-rear direction shown in FIG. 3 and FIG. 4, that is, a direction perpendicular to a paper surface) can be set according to an actual situation and is not limited by the embodiments of the present application.

In an embodiment of the present application, the strip gaps 9 of the support film layer of the module structure penetrate the film layer body 8 in the vertical direction (i.e., the front-rear direction shown in FIG. 3 and FIG. 4). Thereby a stress relief ability of the module structure according to embodiments of the present application is further improved.

In another embodiment of the present application, the strip gaps 9 of the support film layer of the module structure do not penetrate the film layer body 8 in the vertical direction (i.e., the front-rear direction shown in FIG. 3 and FIG. 4). Thereby, water vapor, oxygen, dust and the like are effectively blocked from invading into other film layers of the module structure through the strip gaps 9 penetrating the film layer body 8 (such as a TP layer) to further affect an overall functional effect of the module structure.

In an embodiment of the present application, the strip gaps 9 of the support film layer of the module structure are arranged to intersect each other (but it needs to ensure that the strip gaps 9 intersecting each other and straight lines which the strip gaps 9 are located cannot occur an incision on the non-extension direction of the film layer body 8 in a bending state, so as not to affect appearances of the support film layer and the module structure). The film layer body 8 according to the embodiment of the present application is divided into a plurality of sub-blocks. Thereby, the stresses generated by the module structure and the support film layer in the bending process are reduced.

In an embodiment of the present application, each strip gap 9 of the support film layer of the module structure has a width of 0 mm to 1 mm. It may be understood that, by setting the widths of the strip gaps 9 from 0 mm to 1 mm, the insufficient support strength of the support film layer, which is caused by excessive gaps and may cause a screen damage, is prevented.

In an embodiment of the present application, the number of the strip gaps 9 of the support film layer of the module structure is multiple. Spacing between adjacent strip gaps 9 in a longitudinal direction (i.e., a up-down direction along the orientation shown in FIG. 3 and FIG. 4) is from 1 mm to 40 mm. Setting the spacing between adjacent strip gaps 9 from 1 mm to 40 mm not only ensure the relief stress effect of the strip gaps 9, but also ensure the support effect of the support film layer.

It may be understood that the stress relief gaps are set to be linear gaps, and the both ends of the non-extension direction of the film layer body 8 are not penetrated by the linear gaps and extension lines of the linear gaps. Therefore, the appearance of the incision of the film layer body 8 during the bending process may be effectively prevented, and thereby the bending performance of the module structure is improved.

In addition, it may be understood that when the bending direction of the film layer body 8 is changed (for example, the bending direction is changed to a direction in which the upper and lower ends of the film layer body 8 of the support film layer shown in FIG. 3 and FIG. 4 are upward or downward), the orientations of the strip gaps can also be adaptively adjusted to further prevent the appearance of the incision of the film layer body 8 during the bending process. The adjustment orientations for specific adjustment refer to the above embodiments, and are not described in detail in the embodiment.

In an embodiment of the present application, the linear gaps include curved gaps. The curved gaps can also be flexibly set according to the setting positions and the setting manners of the strip gaps mentioned in the above embodiments. By setting the linear gaps to the curved gaps, the appearance of the incision of the film layer body 8 during the bending process may be effectively prevented, and thereby the bending performance of the module structure is improved.

In an embodiment of the present application, the linear gaps include fold linear gaps. The fold linear gaps can also be flexibly set according to the setting positions and the setting manners of the strip gaps mentioned in the above embodiments. By setting the linear gaps to the fold linear gaps, the stress relief ability of the support film layer of the module structure according to embodiments of the present application may be improved, and thereby the bending performance of the module structure is improved.

Figure 5:
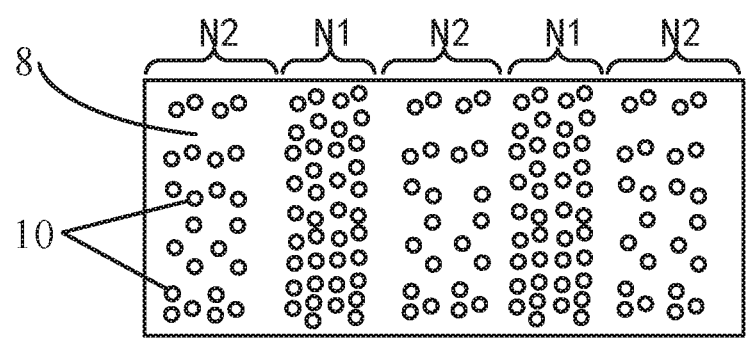
FIG. 5 is a schematic top plan structural diagram of a support film layer of a module structure according to still another embodiment of the present application.

FIG. 5 is a schematic top plan structural diagram of a support film layer of a module structure according to still another embodiment of the present application. As shown in FIG. 5, the support film layer of the module structure according to the embodiment of the present application includes a film layer body 8 and hole-shaped gaps 10 disposed in an upper surface of the film layer body 8. The hole-shaped gaps 10 are circular holes, and the circular holes have a same aperture. Specifically, according to an actual bending condition, the film layer body 8 is divided into a bending area N1 and a non-bending area N2. A density of hole-shaped gaps 10 in the bending area N1 is larger than a density of hole-shaped gaps 10 in the non-bending area N2.

It may be understood that the division of the bending area N1 and the non-bending area N2 of the film layer body 8 can be performed according to an actual bending condition of the support film layer, which is not limited in the embodiments of the present application.

In the module structure according to the embodiments of the present application, the film layer body of the support film layer is divided into a bending area and a non-bending area, hole-shaped gaps with a same aperture are respectively set in the bending area and the non-bending area, and a density of the hole-shaped gaps in the bending area is different from that in the non-bending area. The stress generated by the support film layer (especially the bending area) during the bending process is regionally alleviated, and thereby the shedding of the film layers occurred in the module structure is effectively prevented.

In addition, it may be understood that since the stress relief gaps are set to be the hole-shaped gaps, the appearance of the incision of the film layer body 8 during the bending process may be sufficiently avoided. Thereby, bending mechanical reliability of the module structure according to the embodiment of the present application is improved.

Figure 6:
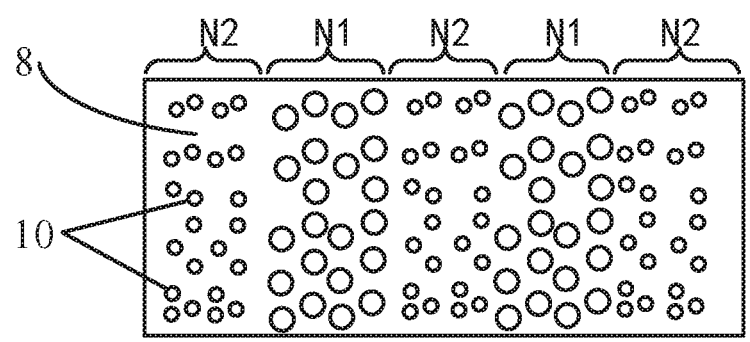
FIG. 6 is a schematic top plan structural diagram of a support film layer of a module structure according to yet still another embodiment of the present application.

FIG. 6 is a schematic top plan structural diagram of a support film layer of a module structure according to yet still another embodiment of the present application. The embodiment of the present application extends on the basis of the embodiment shown in FIG. 5 of the present application. Differences are described below, and similarities are not described again.

As shown in FIG. 6, in the module structure according to the embodiment of the present application, a density of the hole-shaped gaps 10 in the bending area N1 of the film layer body 8 and a density of the hole-shaped gaps 10 in the non-bending area N2 of the film layer body 8 are consistent, but apertures of the hole-shaped gaps 10 in the bending area N1 are larger than that in the non-bending area N2.

In the module structure according to the embodiments of the present application, the film layer body of the support film layer is divided into a bending area and a non-bending area, hole-shaped gaps with a same density are respectively set in the bending area and the non-bending area, and apertures of the hole-shaped gaps in the bending area is different from that in the non-bending area. The stress generated by the support film layer (especially the bending area) during the bending process is regionally alleviated, and thereby the shedding of the film layers occurred in the module structure is effectively prevented.

It may be understood that, in the module structure according to the embodiment shown in FIG. 5 and FIG. 6 of the present application, a shape, a density and an aperture of each hole-shaped gap 10 of the support film layer can be freely set according to actual conditions, including but not limited to the cases listed in the embodiments of the present application. For example, the hole-shaped gaps 10 may be set to be rectangular holes, polygonal holes or elliptical holes.

In an embodiment of the present application, densities and apertures of the hole-shaped gaps 10 in the bending area N1 of the film layer body 8 of the support film layer are consistent with that in the non-bending area N2.

In another embodiment of the present application, the hole-shaped gaps 10 are arranged only in the bending area N1 of the film layer body 8 of the support film layer, and the hole-shaped gaps 10 are no longer arranged in the non-bending area N2. Thereby, process complexity and process cost are reduced while the bending performance of the module structure is ensured.

It may be understood that the hole-shaped gaps 10 mentioned in the above embodiments of the present application may be through holes and/or blind holes (i.e., non-through holes). Thereby, an extensive application ability of the support film layer of the module structure mentioned in the embodiments of the present application is sufficiently improved.

In another embodiment of the present application, the hole-shaped gaps 10 are blind holes. The blind holes are disposed in a side of the film layer body 8 close to the touch layer 4. Therefore, by setting the hole-shaped gaps 10 to be the blind holes, foreign matters such as water vapor, oxygen and dust, which may effect the overall function and effect of the module structure, may be effectively blocked from invading into other film layers of the module structure (such as the touch layer) through the hole-shaped gaps 10.

In an embodiment of the present application, the hole-shaped gaps 10 are circular holes. Diameters of the circular holes are 30 μm to 300 μm. By setting the diameters of the circular holes to be from 30 μm to 300 μm, the stress relief effect of the hole-shaped gaps 10 and the support effect of the support film layer may be ensured.

In another embodiment of the present application, the hole-shaped gaps 10 are circular holes. The diameters of the circular holes are 30 μm to 50 μm. By setting the diameters of the circular holes to be from 30 μm to 50 μm, the stress relief effect of the hole-shaped gaps 10 may be ensured, and the support effect of the support film layer may be further ensured. Thereby, a screen damage caused by the insufficient support strength of the support film layer is prevented.

In an embodiment of the present application, the hole-shaped gaps 10 are circular holes. Diameters of the circular holes in the bending area N1 are 300 μm, and diameters of the circular holes in the non-bending area N2 are 30 μm.

In another embodiment of the present application, the hole-shaped gaps 10 are circular holes. Diameters of the circular holes in the bending area N1 are 150 μm, and diameters of the circular holes in the non-bending area N2 are 30 μm.

In another embodiment of the present application, the hole-shaped gaps 10 are circular holes. Diameters of the circular holes in the bending area N1 are 50 μm, and diameters of the circular holes in the non-bending area N2 are 30 μm.

In an embodiment of the present application, the film layer body 8 of the support film layer of the module structure includes a linear gap and a hole-shaped gap. Therefore, the stress generated by the module structure during the bending process is better released, and the shedding of the film layers occurred in the module structure is effectively prevented. Specific setting positions of the linear gap and the hole-shaped gap are not limited in this embodiment and can be flexibly set according to actual conditions.

In another embodiment of the present application, the film layer body 8 of the support film layer of the module structure includes a linear gap and a hole-shaped gap.

The linear gap and the hole-shaped gap are disposed in a non-display area (i.e., the bending area N1) of the film layer body 8. Therefore, the bending ability of the module structure according to the embodiment of the present application is improved, and influence of the linear gap and/or the hole-shaped gap on the normal function of the module structure is reduced.

Figure 7:
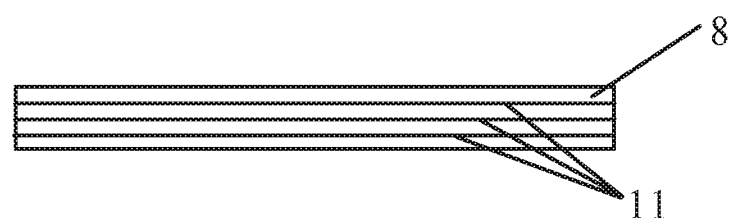
FIG. 7 is a schematic front structural diagram of a support film layer of a module structure according to yet still another embodiment of the present application.

FIG. 7 is a schematic front structural diagram of a support film layer of a module structure according to another embodiment of the present application. As shown in FIG. 7, in the embodiment of the present application, the stress relief gaps are layer gaps 11. The layer gaps 11 are parallel to the upper surface and/or the lower surface of the film layer body 8 of the support film layer (i.e., the upper surface and the lower surface of the film layer body 8 along the orientation shown in FIG. 7). The film layer body 8 is longitudinally (a up-down direction in the film layer body 8 along the orientation shown in FIG. 7) divided into a plurality of laminated sub-layers by the layer gaps 11. The circumferential edge of the film layer body 8 is penetrated by the layer gaps 11. That is, the sub-layers are sequentially stacked longitudinally to form the film layer body 8. Each layer gap 11 is disposed between two adjacent sub-layers.

In the support film layer of the module structure according to the embodiment of the present application, the stress relief gaps are set as the layer gaps, that is, the film layer body of the support film layer is longitudinally divided into the plurality of sub-layers. Therefore, the bending stress generated by the support film layer is sufficiently alleviated and the appearance of the bending incision of the film layer body 8 may be sufficiently avoided.

It may be understood that the number of the layer gaps 11 may be set according to actual needs, which is not limited in the embodiments of the present application.

In addition, it may be understood that each sub-layer may also include a stress relief gap such as a linear gap or a hole-shaped gap to further improve the stress relief ability of the module structure according to the embodiment of the present application. A specific setting manner and a setting position of the stress relief gap may be determined according to actual situations and the above embodiments, which is not described in detail in the embodiment.

In an embodiment of the present application, the linear gaps and/or the hole-shaped gaps mentioned in the above embodiments of the present application are disposed in the non-display areas of the sub-layers of the support film layer (i.e., the bending areas of the sub-layers). Therefore, the bending ability of the module structure according to the embodiment of the present application is improved, while the influence of the linear gap and/or the hole-shaped gap on the normal function of the module structure is minimized.

In an embodiment of the present application, a flexible display device is provided. The flexible display device includes the module structure mentioned in any of the above embodiments.

In another embodiment of the present application, an electronic device is further provided. The electronic device includes the flexible display device mentioned in the above embodiments. The electronic device includes, but not limited to, an electronic device having an electronic display screen such as a mobile phone, a tablet computer or a display.

The above embodiments are only the preferred embodiments of the present application, and are not intended to limit the scope of the present application. Any modification, equivalent substitution, improvement, etc. made within the spirit and principles of this application are intended to be included within the scope of the present application.

What is claimed is:

1. A module structure, comprising a support film layer, the support film layer comprising a film layer body and a plurality of stress relief gaps disposed in the film layer body, the stress relief gap comprising a layer gap, the film layer body being divided into stacked sub-layers by the layer gap;

wherein the film layer body comprises a bending area and a non-bending area, and wherein, among the plurality of stress relief gaps, two or more stress relief gaps are disposed in the non-bending area of the film layer body and two or more stress relief gaps are disposed in the bending area of the film layer body.

2. The module structure of claim 1, wherein the plurality of stress relief gaps further comprises at least one linear gap disposed in at least one of the sub-layers of the film layer body.

3. The module structure of claim 2, wherein the linear gap comprises one or a combination of a strip gap, a curved gap and a fold linear gap.

4. The module structure of claim 3, wherein the strip gap is disposed along a direction parallel to an extension direction of the sub-layers and extends through both ends of at least one of the sub-layers in the extension direction of the sub-layers.

5. The module structure of claim 4, wherein at least one of the sub-layers comprises a plurality of strip gaps arranged at intervals, and the plurality of strip gaps are located in a same straight line.

6. The module structure of claim 4, wherein at least one of the sub-layers comprises a plurality of strip gaps arranged at intervals, and in a same sub-layer, spacing between adjacent strip gaps in a longitudinal direction is from 1 mm to 40 mm.

7. The module structure of claim 3, wherein the strip gap is disposed along a direction parallel to an extension direction of the sub-layers and does not extend through both ends of the extension direction of the film layer body.

8. The module structure of claim 1, wherein the plurality of stress relief gaps further comprises a hole-shaped gap disposed in the bending area of at least one of the sub-layers.

9. The modular structure of claim 8, wherein the hole-shaped gap is a circular hole.

10. The modular structure of claim 9, wherein a diameter of the circular hole is from 30 mm to 300 mm.

11. The module structure of claim 8, wherein the plurality of stress relief gaps further comprises a hole-shaped gap disposed in the non-bending area of at least one of the sub-layers, an aperture of the hole-shaped gap in the bending area is consistent with an aperture of the hole-shaped gap in the non-bending area, and a density of the hole-shaped gap in the bending area is greater than a density of the hole-shaped gap in the non-bending area.

12. The module structure of claim 11, wherein the hole-shaped gap disposed in the non-bending area is a blind hole.

13. The module structure of claim 8, wherein the plurality of stress relief gaps further comprises a hole-shaped gap disposed in the non-bending area of at least one of the sub-layers, a density of the hole-shaped gap in the bending area is different than a density of the hole-shaped gap in the non-bending area, and an aperture of the hole-shaped gap in the bending area is larger than an aperture of the hole-shaped gap in the non-bending area.

14. The module structure of claim 13, wherein the hole-shaped gap disposed in the non-bending area is a blind hole.

15. The module structure of claim 8, wherein the hole-shaped gap disposed in the bending area is a blind hole.

16. The module structure of claim 8, wherein any two strip gaps do not intersect or are not parallel.

17. A flexible display device, comprising the module structure according to claim 1.

18. The module structure of claim 1, wherein the stress relief gaps are layer gaps, the layer gaps are parallel to the upper surface and/or the lower surface of the film layer body of the support film layer.

* * * * *